United States Patent [19]
Hirai et al.

[11] Patent Number: 5,850,349
[45] Date of Patent: Dec. 15, 1998

[54] METHOD AND APPARATUS FOR DISPLAYING THE PLACEMENT OF CIRCUIT BLOCKS AND THE ROUTING NETS BETWEEN CIRCUIT BLOCKS

[75] Inventors: Kazuhiro Hirai, Nagoya; Katsuhiro Kawano, Saga-ken; Toshiyuki Katada, Owariasahi, all of Japan

[73] Assignee: Hitachi, Ltd., Tokyo, Japan

[21] Appl. No.: 553,919

[22] Filed: Nov. 6, 1995

[30] Foreign Application Priority Data

Nov. 7, 1994 [JP] Japan .................................. 6-272070

[51] Int. Cl.⁶ .................................................. G06F 17/50
[52] U.S. Cl. ...................... 364/491; 364/488; 364/489; 364/490
[58] Field of Search .................... 364/490, 489, 364/491, 488, 577, 578

[56] References Cited

U.S. PATENT DOCUMENTS

| 5,247,455 | 9/1993 | Yoshikawa | 364/490 |
| 5,555,201 | 9/1996 | Dangelo et al. | 364/489 |

FOREIGN PATENT DOCUMENTS

| 5-120376 | 5/1993 | Japan | G06F 15/60 |
| 5-128209 | 5/1993 | Japan | G06F 15/60 |

OTHER PUBLICATIONS

Burleson, W. et al. ("ARREST" an interactive graphic analysis tool for VLSI arrays, IEEE Comput. Soc. Press, Proceedins fo the Interanational Conference on Application Specific Array Processors, 4 Aug. 1992, pp. 149–162).

Chen, H. H. ("Pseudo pin assignment for single–layer over–the–cell routing", IEEE Comput. Soc. Press, Proceedings of 1990 IEEE International Conference on Computer Design: VLSI in Computers and Processors, 17 Sep. 1990, pp. 343–346).

Khan, A. et al. ("N:1 time–voltage matrix encoded transmission system", IEEE, Proceedings of the 1989 Bipolar Circuits and Technology Meeting, 18 Sep. 1989, pp. 284–287).

Masson, C. et al. ("CHEOPS: an integrated VLSI floor planning and chip assembly system implemented in object oriented Lisp", IEEE Comput. Soc. Press, Proceedings of the European Design Automation, 12 Mar. 1990, pp. 250–256).

(List continued on next page.)

Primary Examiner—Vincent N. Trans
Assistant Examiner—Phallaka Kik
Attorney, Agent, or Firm—Fay, Sharpe, Beall, Fagan, Minnich & McKee

[57] ABSTRACT

A method and apparatus for displaying the placement of circuit blocks and the routing nets between the circuit blocks, in which: a large number of parts placed on a printed-circuit board or in a semiconductor integrated circuit are classified into a plurality of circuit blocks so that the circuit blocks are displayed; routing nets, in each of which a plurality of connection wires between circuit blocks are integrated expressed as one connection line, are displayed so as to be different in line width, line color or line pattern correspondingly to the number and kind of the connection wires in each routing net; the integrated connection lines are connected to input/output virtual pins provided in the respective circuit blocks; and the relations in arrangement/wiring among the circuit blocks, the integrated connection lines and the virtual pins are displayed on a display device so as to be observed easily by eyes.

10 Claims, 9 Drawing Sheets

OTHER PUBLICATIONS

Taie, M. R. et al. ("MUPLES: an expert system for multipoint cirucit layout", IEEE IEEE Global Telecommunications Conference and Exhibition: Communications Technology for the 1990s and Beyond, 27 Nov. 1989, vol. 1, pp. 496–500).

Yao, X. et al. ("A new approach to the pin assigment problem", IEEE, Proceedings of 25th ACM/IEEE Design Automation Conference, 12 Jun. 1988, pp. 566–572).

Brasen, D. R. et al. ("MHERTZ: a new optimization algorithm for floorplanning and global routing", IEEE, Proceedings of 27th ACM/IEEE Design Automation Conference, 24 Jun. 1990, pp. 107–110).

Babb, J. et al. ("Virtual wires: overcoming pin limitations in FPGA–based logic emulators", IEEE Comput. Soc. Press, Proceedings of IEEE Workshop on FPGAs for Custom Computing Machines, 5 Apr. 1993, pp. 142–151).

FIG.8A

BLOCK TABLE

| BLOCK NAME | GAME TABLE POINTER |
|---|---|
| a | ⑩ |
| b | — |
| c | ⑪ |
| d | ⑬ |
| e | ⑮ |
| f | ⑯ |
|  |  |

FIG.8B

GATE TABLE

|  | COORDINATES | PARTS NAME | BLOCK TABLE POINTER | SAME BLOCK CHAIN |
|---|---|---|---|---|
| ⑩ |  | AND | a | — |
| ⑪ |  | OR | c | ⑫ |
| ⑫ |  | M-MACRO | c | — |
| ⑬ |  | FF | d | ⑭ |
| ⑭ |  | RAM2 | d | — |
| ⑮ |  | RAM3 | e | — |
| ⑯ |  | RAM | f | — |
|  |  |  |  |  |

FIG.8C

SIGNAL TABLE

| SIGNAL NAME | TERMINAL TABLE POINTER | LINE KIND |
|---|---|---|
| ABUS | (11) | ADDRESS BUS |
| DBUS | (15) | DATA BUS |
| | | |

FIG.8D

TERMINAL TABLE

| | COORDINATES | GATE TABLE POINTER | SAME SIGNAL CHAIN |
|---|---|---|---|
| (11) | | ⑩ | (12) |
| (12) | | ⑫ | (13) |
| (13) | | ⑬ | (14) |
| (14) | | ⑯ | — |
| (15) | | ⑪ | (16) |
| (16) | | ⑭ | (17) |
| (17) | | ⑮ | — |
| | | | |

FIG.9A

INTER-BLOCK CONNECTION TABLE

|   | a | b | c | d | e | f |
|---|---|---|---|---|---|---|
| a | ① | — | — | ② | — | — |
| b |   | — | — | — | — | — |
| c |   |   | ③ | ④ | — | — |
| d |   |   |   | ⑤ | ⑥ | ⑦ |
| e |   |   |   |   | ⑧ | — |
| f |   |   |   |   |   | ⑨ |

FIG.9B

LINE KIND TABLE

| LINE KIND | PATTERN | COLOR |
|---|---|---|
| ADDRESS BUS |  | BLUE |
| DATA BUS |  | GREEN |
| TOTAL BUS |  | BLACK |
|  |  |  |

FIG.9C

INTEGRATION ITEM TABLE

| LINE KIND | VIRTUAL PIN COORDINATES | LINE WIDTH POINTER |
|---|---|---|
| ADDRESS |  |  |
| DATA BUS |  |  |
|  |  |  |

FIG.9D

LINE WIDTH TABLE

|     | MINIMUM NUMBER OF CONNECTION WIRES | MAXIMUM NUMBER OF CONNECTION WIRES | LINE WIDTH |
|-----|------|------|----|
| (1) | 1    | 4    | 1  |
| (2) | 5    | 15   | 3  |
| (3) | 16   | 31   | 5  |
| (4) | 32   | 63   | 9  |
| (5) | 64   | —    | 15 |
|     |      |      |    |

FIG.9E

EXAMPLES OF DATA STORED IN INTEGRATION ITEM TABLE

① 
| (x1,y1) | — |
|---------|---|
| —       | — |

② 
| — | (4) |
|---|-----|
| — | —   |

③ 
| (x3,y3) | — |
|---------|---|
| (x2,y2) | — |

④ 
| — | (4) |
|---|-----|
| — | (2) |

⑤ 
| (x4,y4) | — |
|---------|---|
| (x5,y5) | — |

⑥ 
| — | —   |
|---|-----|
| — | (2) |

⑦ 
| — | (4) |
|---|-----|
| — | —   |

⑧ 
| —       | — |
|---------|---|
| (x6,y6) | — |

⑨ 
| (x7,y7) | — |
|---------|---|
| —       | — |

METHOD AND APPARATUS FOR DISPLAYING THE PLACEMENT OF CIRCUIT BLOCKS AND THE ROUTING NETS BETWEEN CIRCUIT BLOCKS

BACKGROUND OF THE INVENTION

FIELD OF THE INVENTION

The present invention relates to a method and apparatus in which a large number of parts arranged on a printed-circuit board or in a semiconductor integrated circuit, especially in an LSI, are classified into a plurality of circuit blocks (hereinafter simply referred to as "blocks") and the placement of the blocks and the routing nets between the blocks are displayed.

There is conventionally known an apparatus in which the placement of a large number of parts to be incorporated into an LSI and the routing nets between the parts are performed and displayed automatically under computer control. There is further known an apparatus in which such a large number of parts are classified into a plurality of blocks and the routing nets between the blocks is displayed.

Further, even in the case where a large number of parts are placed on a printed-circuit board or in a semiconductor integrated circuit so that the routing nets between the parts are formed automatically by computer-aided design, the placement of the designed parts is not always said to be an optimum placement and, in most cases, it is necessary to modified the placement of the parts. As literatures which discloses such a parts-placement modifying technique, there are JP-5-120376 and JP-5-128209.

By the aforementioned conventional technique, the placement of parts and the routing nets between the parts are displayed on a display screen as shown in FIG. 3. That is, as shown in FIG. 3, a number of parts 71 are placed on a display screen 100, wires 10 between the parts are expressed by broken lines, and furthermore, blocks 7a to 7c, each of which is formed by modifying a plurality of parts, are displayed. In this example, the parts are logical gates such as AND gates, OR gates, NOR gates, etc., and the blocks are unit logical circuits each of which is a set of the logical gates and has a certain independent logical function. Each part has one or more terminals, so that connection of parts is performed by routing nets connecting the terminals. All the routing nets are displayed individually on the screen.

In the display of routing nets between parts in the conventional technique, wires between terminals of parts are displayed individually. Accordingly, in the case of a printed-circuit board or an integrad circuit, having hundreds of parts or more placed therein, an extremely large deal of wiring is required for indicating the connection relations between parts so that the connection relations between parts cannot be identified sufficiently because wires between parts overlap one another several times. Furthermore, in the case of an LSI having a larger number of logical gates than tens of thousands, the quantity of information concerning connection between terminals of parts is so large that not only the display speed of connection information is very slow but also it is impossible to check the connection relations between parts or blocks by sight. In such a case, it may be thought of that the display region is limited or a specific block can be designed to be displayed. It is however impossible to recognize the wiring relations between parts or blocks on the whole semiconductor integrated circuit or on the whole printed-circuit board at a glance.

SUMMARY OF THE INVENTION

An object of the present invention is to provide a method and apparatus for displaying the placement of blocks and the routing nets between the blocks, in which a large number of parts mounted in a semiconductor integrated circuit or on a printed-circuit board are classified into a plurality of blocks so that the routing relations between the blocks can be recognized easily by eye observation.

According to the present invention, a large number of parts are classified into a plurality of blocks so that the routing relations between the parts are integratedly displayed by using at least one of thickness, hue and pattern of routing nets connecting the blocks correspondingly to the number of wires and the kind of wires.

In this manner, the routing relations between the blocks are integratedly displayed while discriminated by the thickness, hue or pattern of lines correspondingly to the number of wires and the kind of wires, so that the routing relations between a large number of parts can be recognized easily by eye observation. Accordingly, the placement of parts or blocks can be modified while defects in the circuit placement relations are easily checked by sight, so that circuit placement and routing in a large-scale high-density semiconductor integrated circuit or printed-circuit board can be designed in a short time with high quality.

BRIEF DESCRIPTION OF THE DRAWINGS

FIGS. 8A to 8D show examples of input of information concerning the coordinates of parts and blocks depicted in FIG. 7 and the wiring therebetween; and FIGS. 9A to 9E show various tables in which results calculated and items determined on the basis of input information depicted in FIGS. 8A to 8D are collected.

DETAILED DESCRIPTION OF THE PREFERRED EMBODIMENT

An embodiment of the present invention will be described below in detail with reference to the drawings.

Figure 1:
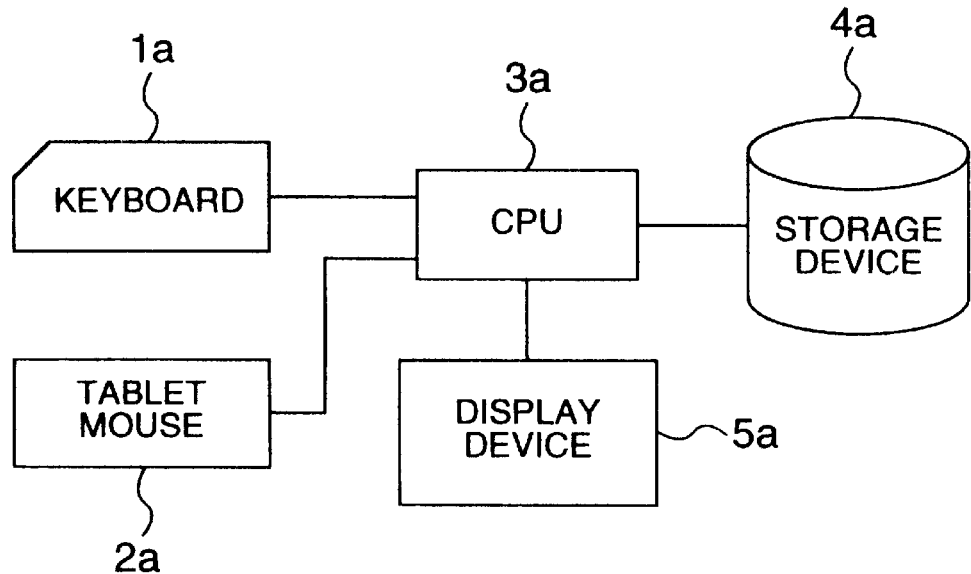
FIG. 1 is a block diagram showing the schematic configuration of an apparatus according to the present invention.

FIG. 1 is a diagram showing the schematic configuration of an apparatus for displaying the placement of blocks and the routing nets between the blocks according to the present invention. In FIG. 1, the reference numeral 1a designates a keyboard for inputting data; 2a, a tablet or mouse for inputting drawing data and directing a pointer; 3a, a CPU for placing and placement-modifying parts or blocks on the basis of data given from the keyboard 1a, or the tablet or mouse 2a; 4a, a storage device for storing data given from the keyboard 1a, or the like, and storing control programs; and 5a, a display device for displaying the placement of parts or blocks and the routing nets between the blocks. As will be described later, display data given from the keyboard 1*a*, or the like, that is, parts or blocks placement information and wiring information, are processed by the CPU 3*a*, so that the placement of blocks and the routing nets between the blocks are displayed collectively as processed results by the display device 5*a*.

Figure 2:
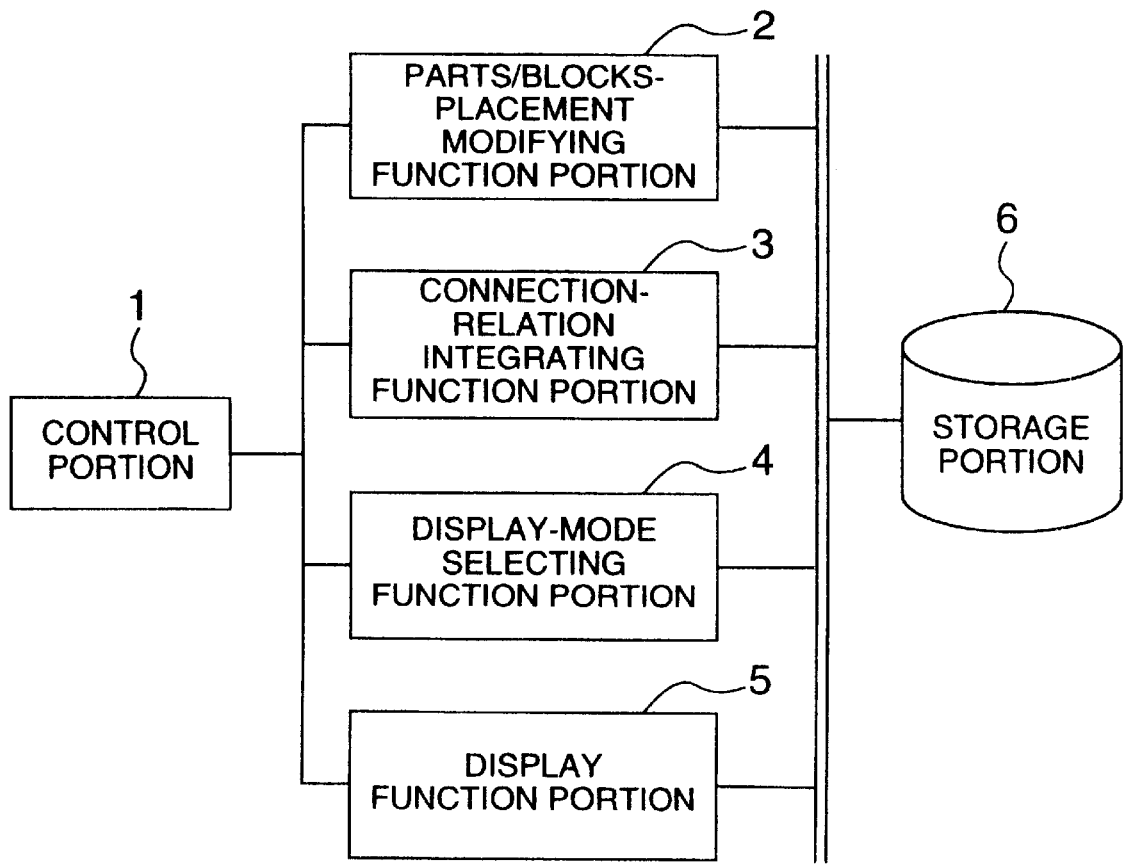
FIG. 2 is a diagram showing the functional configuration of a CPU which is an important part of the present invention.
Figure 3:
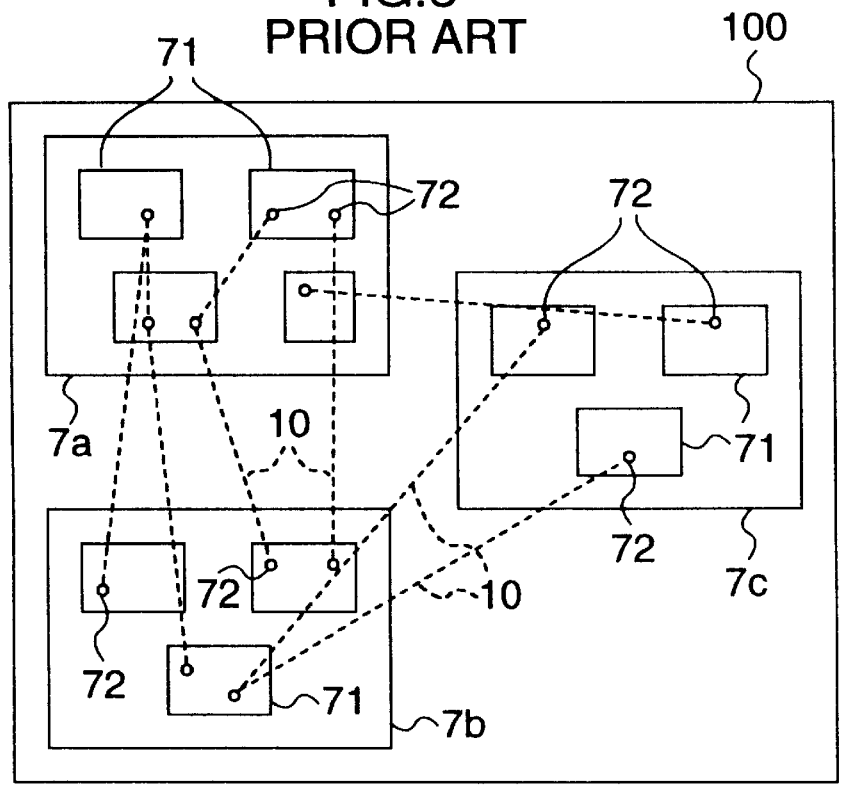
FIG. 3 is a diagram showing an example of a result displayed by a conventional apparatus.

FIG. 2 is a diagram showing the more detailed functional configuration of the CPU 3*a*. In FIG. 2, when new placement positions of parts or blocks are inputted to modify the placement positions of parts or blocks displayed on the display device 5*a*, a parts/blocks-placement modification functional portion 2 modifys the placement positions of the parts/blocks. A connection-relation integration functional portion 3 performs a function of integrating connection relations for every block on the basis of input information expressing connection relations between terminals of numbers of parts. That is, the widths, colors and patterns of connection lines are determined for every block correspondingly to the number and kind of routing nets. A display-mode selection functional portion 4 has a function of selectively switching over between the display of the integrated connections relations for every block according to the present invention and the display of all routing nets between parts or blocks in a conventional mode. The display-mode selection functional portion 4 can select at least one of the width, color and pattern of displayed routing nets as a display mode to improve ease in watching and handling. A display functional portion 5 displays the arrangement of necessary parts or blocks and the wiring therebetween on a display screen on the basis of the operation of the aforementioned functional portions 2 to 4. A storage portion 6 stores information such as input data, display mode, etc. A control portion 1 controls the aforementioned portions 2 to 5 and the storage portion 6.

Figure 4:
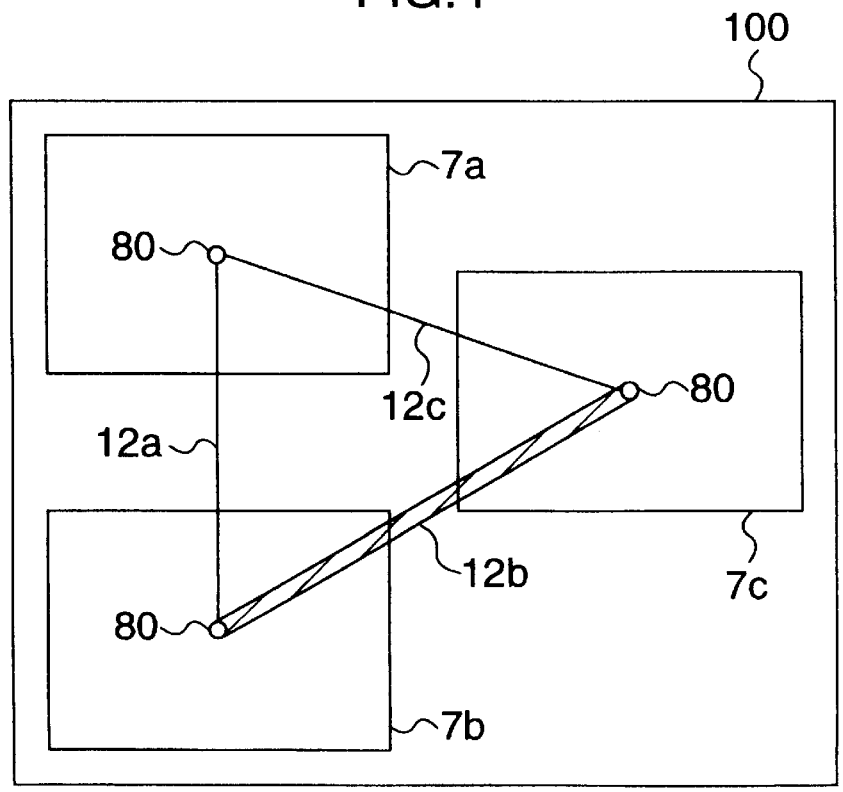
FIG. 4 is a diagram showing an example of a result displayed by the apparatus according to the present invention.

FIG. 4 shows an example of screen display according to the present invention. In FIG. 4, parts assembled as integrated circuits are indicated for every block on the display screen 100. A plurality of blocks 7*a* to 7*c* are placed as shown in FIG. 4. A plurality of terminals in each block are collectively indicated as one virtual pin 80. Routing nets between respective blocks are integiatedly displayed as connection lines 12*a* to 12*c* each of which connects virtual pins 80.

The connection lines 12*a* to 12*c* between blocks are designed so as to be different in width correspondingly to the number of wires and so as to be different in pattern correspondingly to the kind of wires. In the example of FIG. 4, the connection line 12*a* connecting blocks 7*a* and 7*b* is expressed by the broken line of a standard width, the connection line 12*c* connecting blocks 7*a* and 7*c* is expressed by the solid line of the standard width, and the connection line 12*b* connecting blocks 7*b* and 7*c* is expressed by the thick line of a hatched line pattern. The width of each of the connection lines expresses the number of wires contained therein. The broken line, solid line and hatched line which express the connection lines 12*a*, 12*b* and 12*c* express the respective kinds of line such as data bus, address bus, clock line, diagnosis line, etc.

Incidentally, in the present invention, the kinds of the lines can be expressed by not only the widths and shapes (such as solid line, broken line, etc.) of lines but also by various forms of lines such as hue, density, pattern, curve, etc. For example, the connection lines 12*a* and 12*b* may be identified by lines different in density in a manner so that the significance or priority of the lines is higher as the density of the lines is higher. Further, the virtual pins 80 may be provided in arbitrary positions or need not be displayed so long as corresponding blocks can be identified. As for the kinds of lines, any display mode can be selected by the display-mode selection functional portion 4 correspondingly to the objects of the logical functions of corresponding blocks. In the present invention, functions and features of various connection lines can be displayed by using various display modes in combination in the manner as described above.

Figure 5:
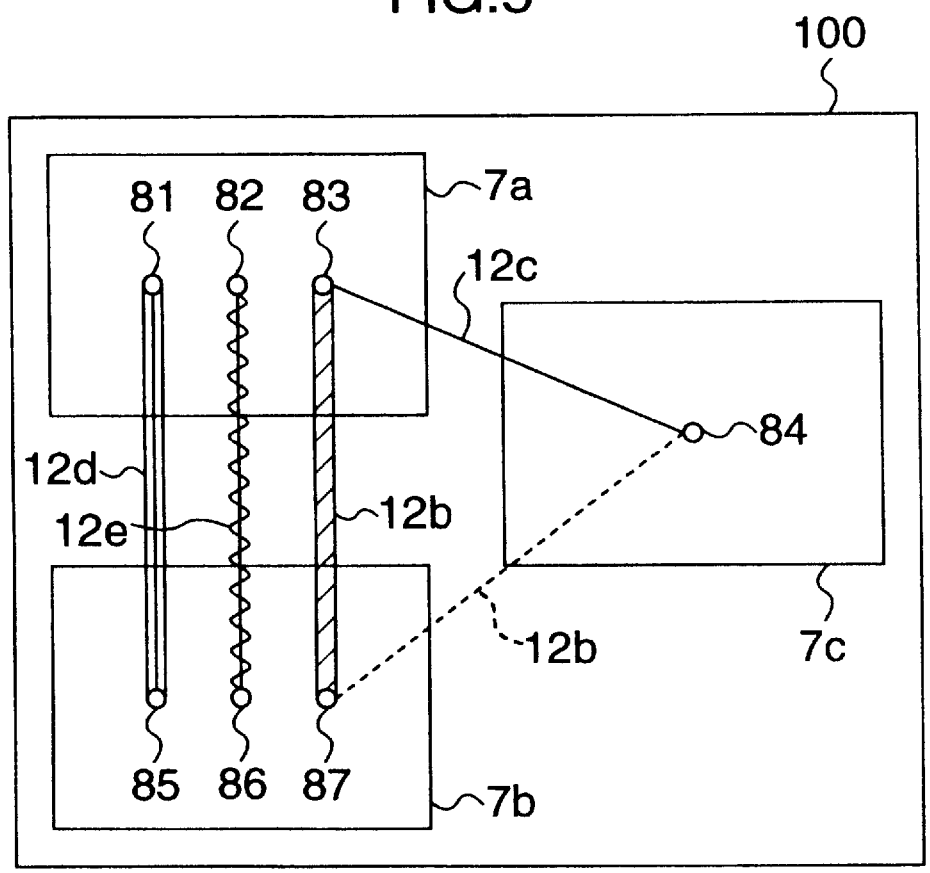
FIG. 5 is a diagram showing another example of a result displayed by the apparatus according to the present invention.

FIG. 5 shows another example of display according to the present invention. In this embodiment, a printed-circuit board is displayed on the screen 100. Three parts 7*a* to 7*c* are mounted on the printed-wiring substrate. These parts are semiconductor integrated circuits. In each of the parts, one or more virtual pins 81 to 87 are provided correspondingly to the kinds of lines. Connection lines 12*a* to 12*c* having various shapes or patterns corresponding to the kinds of lines are displayed between the virtual pins. Each of the routing nets 12*a* to 12*c* contains collectively a plurality of wires.

In the embodiment of FIG. 5, the routing net 12*d* connecting the virtual pins 81 and 85 has a pattern of three vertical lines and expresses a data bus. The routing net 12*e* connecting the virtual pins 82 and 86 has a wavy pattern and expresses an address line. The connection lines 12*a*, 12*b* and 12*c* connecting the virtual pins 83, 84 and 87 to one another express different connection states, respectively. The connection line 12*b* is indicated so as to have a larger width than those of the routing nets 12*a* and 12*c* to thereby express that the line 12*b* contains a larger number of wires than those of the routing nets 12*a* and 12*c*. The routing net 12*a* is indicated by the broken line whereas the routing nets 12*b* and 12*c* are indicated by the solid lines, to thereby express that the former is different in kind of wires from the letter. These routing nets may be discriminated by hue and density so that the kind of wires and the number of wires can be expressed, though such routing nets cannot be shown.

Figure 7:
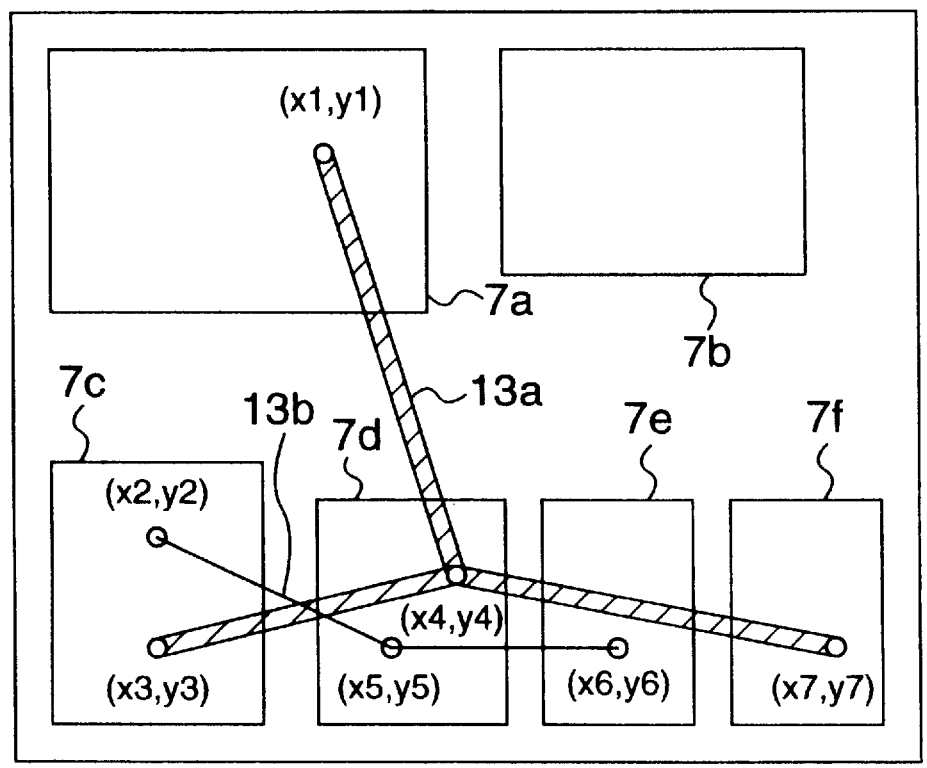
FIG. 7 is a diagram showing a further example of a result displayed by the apparatus according to the present invention.

FIG. 7 is a diagram showing a further example of screen display according to the present invention. In FIG. 7, the placement of blocks on a semiconductor integrated circuit and the states of wiring between the blocks are integratedly displayed. A plurality of blocks 7*a* to 7*f* are placed as shown in FIG. 7. The blocks 7*a* and 7*d*, the blocks 7*d* and 7*c* and the blocks 7*d* and 7*f* are connected by routing nets 13*a* integratedly expressed by a hatched-line pattern of a large width. The routing nets 13*a* express address buses. Further, the blocks 7*c* and 7*d* and the blocks 7*d* and 7*e* are connected by routing nets 13*b* integratedly expressed by the solid line. The routing nets 13*b* express a data buses.

The procedure of the present invention up to the step of obtaining a display screen on which routing states are integratedly displayed as shown in FIG. 7, will be described below with reference to FIGS. 6 through 9.

Upon designing the placement of blocks, a user first inputs necessary information through the keyboard 1*a* or the tablet/mouse 2*a*. The input information is stored in tables shown in FIGS. 8A to 8D. FIG. 8A shows a table on which pointers indicating parts belonging to blocks respectively are stored. FIG. 8B shows a table on which placement coordinates of parts, names of parts, pointers indicating blocks including parts respectively and pointers each indicating the next part belonging to the same block are stored. FIG. 8C shows a table on which names of signals identifying states of routing between terminals of parts, kind s of signals such as an address bus signal, a data bus signal, etc., and pointers indicating a corresponding terminals are stored. FIG. 8D shows a table on which arrangement coordinates of terminals of parts, pointers indicating corresponding parts and pointers each indicating the next terminal corresponding to the same signal are stored. These pieces of information are given in advance in accordance with the specifications of circuit and design.

That is, the respective names a to f of six blocks 6a to 6f in FIG. 7 are written in the left column in FIG. 8A, and corresponding addresses in the gate table (shown in FIG. 8B), on which information concerning logical gates as parts belonging to the respective blocks are stored, are recorded in the gate table pointer column in FIG. 8A. In the case of a block including a plurality of parts, for example, in the case of the block c, the gate table pointer Is (11), so that when the address (11) of the gate table is referred to, the address (12) of another part included in the same block is present on the block chain column which is the right end column of the gate table. Accordingly, information concerning the other part can be seen by referring to the address (12) on the same gate table. The relation between FIGS. 8C and 8D is similar to the relation between FIGS. 8A and 8B, so that a table of terminals classified by the kinds of buses as shown in FIG. 8D is generated.

Figure 6:
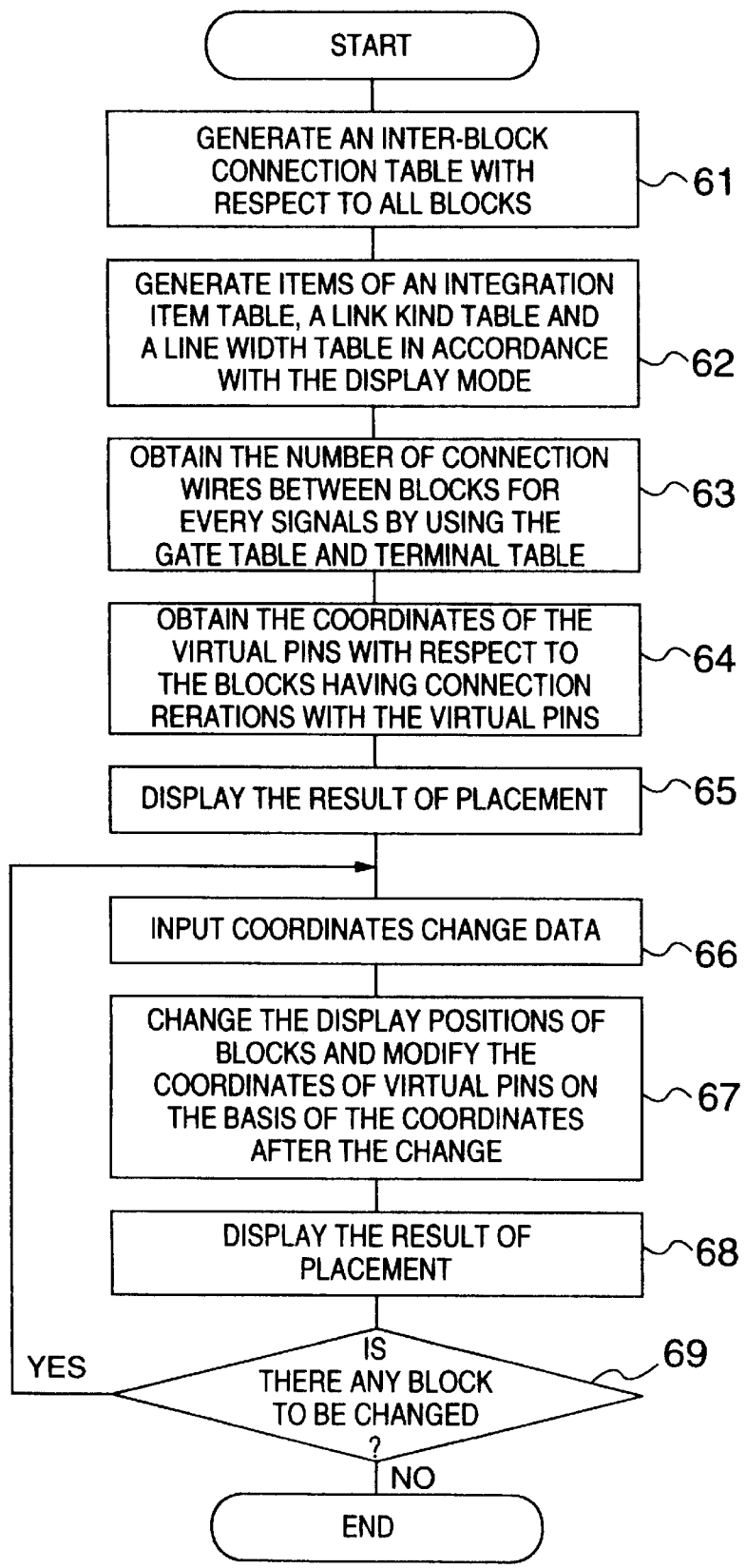
FIG. 6 is a flow chart showing the operation of the apparatus according to the present invention.

The CPU 3a operates in the procedure according to the flow of FIG. 6. In FIG. 6, in step 61, an interblock connection table with respect to all blocks as shown in FIG. 9A is generated on the basis of the block table (as shown in FIG. 8A) which has been already given. In this stage, the interblock connection table is in a not-entered state, that is, in a blank state.

Then, in step 62, a line kind table as shown in FIG. 9B, an integration item table as shown in FIG. 9C and a line width table as shown in FIG. 9D are generated in accordance with a required display mode. As shown in FIG. 9B, the kinds of wires are defined by colors and patterns in advance and stored in the line kind table. For example, the address bus is defined by a hatched pattern and blue. As shown in FIG. 9D, the relations between the numbers of wires and the widths of routing nets integratedly displayed are determined in advance and stored in the line width table. For example, the address (3) is designed so that the width of the routing net is 5 mm when the number of wires is in a range of from 16 to 31. In this stage, the integration item table is blank as shown in FIG. 9C.

Then, in step 63, the respective numbers of wires connecting blocks are obtained for every kind on the basis of the gate table shown in FIG. 8B and the terminal table shown in FIG. 8D and are stored in the memory 6. A method of obtaining the numbers of wires is as follows. Wires corresponding to the kinds of lines in each block are classified by partner blocks to be connected, so that the respective numbers of wires are obtained. As a result, the numbers of wires in routing net between blocks are obtained for every kind and the results are stored in the memory 6.

As for the routing nets between blocks, addresses (2), (4), (6) and (7) of areas for storing routing net information are written in positions in which the signs of blocks connected intersect each other as shown in FIG. 9A. Then, the address of a line width corresponding to the number of wires stored in the memory 6 is read from the line width table of FIG. 9D into the integration item table of FIG. 9C in which respective pieces of information concerning routing nets between blocks are designated by the addresses (2), (4), (6) and (7), so that the address obtained from the line width table is recorded in a recording position corresponding to the kind of wires. For example, in the case of a routing net between blocks a and d, address (2) is found by referring to FIG. 9A, so that address (4) of the line width table indicating the line width of 9 mm is written in a position of intersection between the address bus and the line width pointer as shown in (2) of FIG. 9E.

In step 64, the number of virtual pins as integrated terminals in each block and the respective coordinates of the virtual pins are obtained. A method of obtaining the coordinates of the virtual pins is as follows. Virtual pins are determined correspondingly to the line kind obtained in the step 63. If there is one virtual pin per one block, the coordinates of the virtual pin are determined so as to be in the center of gravity of the shape of the block. If there are a plurality of virtual pins per one block, the virtual pins are arranged so as to be dispersed evenly in the shape of the block. The coordinates of the virtual pins may be determined so as to be in positions of main parts in each routing net. With respect to virtual pins in each block, addresses (1), (3), (5), (8) and (9) of the integration item table shown in FIG. 9C are written in positions of intersection between longitudinal and transverse blocks having an equal sign in FIG. 9A.

Accordingly, the virtual pin information in the block a in FIG. 7 is recorded in the address (1) shown in the intersection portion a—a of FIG. 9A, so that the coordinates of the virtual pin are determined to be (x1, y1) as shown in the address (1) on the integration item table in FIG. 9E. The kind of the line connected to the virtual pin is address bus, so that the coordinates thereof are recorded in a position corresponding to the left upper blank column in FIG. 9C. With respect to terminal information of block b, there is no data recorded in the intersection point b—b in FIG. 9A, so that there is no virtual pin as shown in FIG. 7. With respect to block c, coordinates (x3, y3) and (x4, y4) of two virtual pins are connected to the address (3) of the integration item table so as to correspond to the address bus and the data bus, respectively. Thereafter, information concerning virtual pins are written in the same manner as described above.

As described above, contents of four blank columns in the integration item table shown in FIG. 9C are recorded as shown in FIG. 9E correspondingly to addresses shown in FIG. 9A.

In step 65, the placement of blocks and the connection relations therebetween are displayed as shown in FIG. 7 on the basis of information of blocks, routing nets and virtual pins obtained in the aforementioned steps.

Then, the operator observes the result of display and interactively corrects the display state. That is, in step 66, the coordinates of the display positions of blocks or parts are changed so that the lengths of wires are shortened. Then, in step 67, the display positions of blocks are changed and then the coordinates of virtual pins are corrected on the basis of the coordinates after the change. Then, in step 68, the placement of blocks and routing nets is displayed on the basis of the result of the correction. If the result of the placement shows that it is necessary to further change any block position, the situation of the routine goes back to the step 66 via step 69. If there is no block position required to be changed, the situation of the routine goes to END.

In the display mode selection portion 4, the operator can select a desired display mode judging from the result of display in the step 65 or 68. As for the range of the selection, a mode of displaying all routing nets one by one and a mode of displaying integrated routing nets according to the present invention can be selected and, furthermore, as shown in FIG. 9B, a mode of displaying routing nets integrated correspondingly to buses or a mode of displaying routing nets by integrating all buses into one bus can be selected.

What is claimed is:

1. A method of displaying an arrangement of circuit blocks and routing nets between said circuit blocks, comprising:

a data input step of inputting data concerning a plurality of circuit blocks, parts in said blocks, routing nets between said parts and input/output terminals of said circuit blocks connected to said routing nets;

a routing net integration step of integrating a plurality of routing nets between same circuit blocks into at least one connection line in accordance with the number of routing nets to be integrated on the basis of data inputted in said data input step;

a coordinate setting step of setting coordinates of virtual pins corresponding to terminals through which said routing nets integrated in said routing nets integration step are to be connected to said plurality of circuit blocks;

a virtual pin integration step of integrating a plurality of pins corresponding to the integrated routing nets in each circuit block into one of said virtual pins set by said coordinate setting step;

a step of generating an inter-block connection table indicating positions of virtual pins in each circuit block and positions of the integrated connection lines between circuit blocks;

a step of storing connection line data in an integration item table correspondingly to the positions of said routing nets indicated by said inter-block connection table;

a display-mode setting step of setting at least one display mode selected from various display modes in which said integrated routing nets are expressed by connection lines different in width, in color and in pattern in accordance with the kind and number of said routing nets; and a display step of displaying said blocks, said virtual pins and said connection lines on a display device.

2. A method according to claim 1, wherein said coordinate setting step includes:

a step of setting coordinates of virtual pins by circuit blocks; and a step of storing the coordinates of virtual pins set in the directly-above step into said integration item table correspondingly to the positions of said virtual pins indicated by said inter-block connection table.

3. A method according to claim 1, further comprising:

a step of changing the displayed positions of circuit blocks displayed on said display device;

a step of correcting the coordinates of the virtual pins of said circuit blocks changed with the change of the positions of the circuit blocks in the directly above step correspondingly to the changed positions of circuit blocks; and a step of displaying said circuit blocks, said virtual pins and said routing nets on said display device correspondingly to said circuit blocks and virtual pins corrected in the directly-above step.

4. A system for displaying placement of circuit blocks and wiring between said circuit blocks, comprising:

data input means for inputting data concerning a plurality of circuit blocks, parts in said blocks, wires between said parts and input/output terminals of said circuit blocks connected to said wires;

routing net integration means for integrating a plurality of routing nets between same circuit blocks into at least one connection line in accordance with the number of routing nets to be integrated on the basis of data inputted by said data input means;

coordinate setting means for setting coordinates of virtual pins corresponding to terminals through which said routing nets integrated by said routing net integration means are to be connected to said plurality of circuit blocks;

virtual pin integration means for integrating a plurality of pins corresponding to the integrated routing nets in each circuit block into one of said virtual pins set by said coordinate setting means;

means for generating an inter-block connection table indicating positions of virtual pins in each circuit block and positions of the integrated connection lines between circuit blocks;

means for storing connection line data in an integration item table correspondingly to the positions of said routing nets indicated by said inter-block connection table;

display-mode setting means for setting at least one display mode selected from various display modes in which said integrated routing nets are expressed by connection lines different in width, in color and in pattern in accordance with the kind and number of said routing nets; and a display device for displaying said blocks, said virtual pins and said connection lines on a display device.

5. A system according to claim 4, wherein said coordinate setting means includes:

means for setting coordinates of virtual pins by circuit blocks; and means for storing the coordinates of virtual pins set by the directly-above means into said integration item table correspondingly to the positions of said virtual pins indicated by said inter-block connection table.

6. A system according to claim 4, further comprising:

means for changing the displayed positions of circuit blocks displayed on said display device;

means for correcting the coordinates of the virtual pins of said circuit blocks changed with the change of the positions of the circuit blocks by the directly-above means correspondingly to the changed positions of circuit blocks; and means for displaying said circuit blocks, said virtual pins and said connection lines on said display device correspondingly to said circuit blocks and virtual pins corrected by the directly-above means.

7. A system according to claim 4, wherein said data input means includes at least one member selected from a keyboard, a tablet and a mouse.

8. A system according to claim 4, further comprising:

means for selecting one display mode from a display mode set by said display-mode setting means and a mode in which all wires are displayed without integration.

9. A system according to claim 4, wherein said plurality of circuit blocks are placed on a printed-wiring substrate.

10. A system according to claim 4, wherein said plurality of circuit blocks are placed in a semiconductor integrated circuit.

* * * * *